US012787894B2

(12) United States Patent
Zhang et al.

(10) Patent No.: US 12,787,894 B2
(45) Date of Patent: Nov. 3, 2026

(54) SEMICONDUCTOR PACKAGE STRUCTURE

(71) Applicant: MediaTek Singapore Pte. Ltd., Singapore (SG)

(72) Inventors: Jubao Zhang, Singapore (SG); Zhigang Duan, Singapore (SG); Chang Liang, Singapore (SG); Lian Duan, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 443 days.

(21) Appl. No.: 18/484,579

(22) Filed: Oct. 11, 2023

(65) Prior Publication Data

US 2024/0145367 A1 May 2, 2024

Related U.S. Application Data

(60) Provisional application No. 63/381,764, filed on Nov. 1, 2022.

(51) Int. Cl.
*H10W 90/00* (2026.01)
*H10W 70/65* (2026.01)
(Continued)

(52) U.S. Cl.
CPC ......... *H10W 90/401* (2026.01); *H10W 70/65* (2026.01); *H10W 72/252* (2026.01); (Continued)

(58) Field of Classification Search
CPC ......... H01L 23/49833; H01L 23/49838; H01L 24/13; H01L 24/16; H01L 24/32; H01L 24/73; H01L 2224/13111; H01L 2224/13124; H01L 2224/13139; H01L 2224/13144; H01L 2224/13147;
(Continued)

(56) References Cited

U.S. PATENT DOCUMENTS

2021/0057363 A1 2/2021 Chen
2022/0165721 A1 * 5/2022 Lee ...................... H01L 23/535

FOREIGN PATENT DOCUMENTS

DE 102020128855 A1 11/2021

OTHER PUBLICATIONS

German language office action dated Oct. 8, 2025, issued in application No. DE 10 2023 129 885.2 (English language translation, pp. 1-7 of attachment).

* cited by examiner

*Primary Examiner* — Elias Ullah
(74) *Attorney, Agent, or Firm* — McClure, Qualey & Rodack, LLP

(57) ABSTRACT

A semiconductor package structure includes a substrate, a composite interposer, and a semiconductor die. The composite interposer is disposed over the substrate and includes a first interposer substrate and a second interposer substrate. The first interposer substrate includes a first conductive via and a first dielectric layer. The second interposer substrate is disposed over the first interposer substrate and includes a second conductive via and a second dielectric layer. The second conductive via is bonded to the first conductive via, and the second dielectric layer is bonded to the first dielectric layer. The semiconductor die is disposed over the composite interposer and is electrically coupled to the first conductive via and the second conductive via.

19 Claims, 3 Drawing Sheets

(51) Int. Cl.
*H10W 72/20* (2026.01)
*H10W 72/30* (2026.01)
*H10W 74/15* (2026.01)

(52) U.S. Cl.
CPC .......... *H10W 72/354* (2026.01); *H10W 74/15* (2026.01); *H10W 90/724* (2026.01); *H10W 90/734* (2026.01)

(58) Field of Classification Search
CPC . H01L 2224/13157; H01L 2224/13166; H01L 2224/13169; H01L 2224/13176; H01L 2224/13181; H01L 2224/13184; H01L 2224/16227; H01L 2224/2919; H01L 2224/32225; H01L 2224/73204; H01L 2924/0665; H01L 23/147; H01L 23/5383; H01L 23/5385; H01L 24/08; H01L 23/49816
See application file for complete search history.

SEMICONDUCTOR PACKAGE STRUCTURE

CROSS REFERENCE TO RELATED APPLICATIONS

This application claims the benefit of U.S. Provisional Application No. 63/381,764 filed on Nov. 1, 2022, the entirety of which is incorporated by reference herein.

BACKGROUND OF THE INVENTION

Field of the Invention

The present invention relates to semiconductor technology, and, in particular, to a semiconductor package structure that includes an interposer.

Description of the Related Art

In addition to providing a semiconductor die with protection from environmental contaminants, a semiconductor package structure can also provide an electrical connection between the semiconductor die packaged inside it and a substrate such as a printed circuit board (PCB).

Although existing semiconductor package structures generally meet requirements, they have not been satisfactory in all respects. For example, if an interposer of the semiconductor package structure is too thick (e.g., if it includes more than eight metal layers), the interposer may suffer from warpage and may not be able to proceed with subsequent manufacturing processes. Therefore, further improvements in semiconductor package structures are required.

BRIEF SUMMARY OF THE INVENTION

Semiconductor package structures are provided. An exemplary embodiment of a semiconductor package structure includes a substrate, a composite interposer, and a semiconductor die. The composite interposer is disposed over the substrate and includes a first interposer substrate and a second interposer substrate. The first interposer substrate includes a first conductive via and a first dielectric layer. The second interposer substrate is disposed over the first interposer substrate and includes a second conductive via and a second dielectric layer. The second conductive via is bonded to the first conductive via, and the second dielectric layer is bonded to the first dielectric layer. The semiconductor die is disposed over the composite interposer and is electrically coupled to the first conductive via and the second conductive via.

Another embodiment of a semiconductor package structure includes a substrate, a composite interposer, a bump structure, and a first semiconductor die. The composite interposer is disposed over the substrate and includes a first interposer substrate and a second interposer substrate. The first interposer substrate includes a first conductive via. The first conductive via has a first inclined sidewall. The second interposer substrate is bonded to the first interposer substrate and includes a second conductive via. The second conductive via has a second inclined sidewall connected to the first inclined sidewall. The bump structure electrically couples the composite interposer to the substrate. The first semiconductor die is disposed over the composite interposer and is electrically coupled to the composite interposer.

Yet another embodiment of a semiconductor package structure includes a substrate, a first semiconductor layer, a first interposer substrate, a second interposer substrate, a second semiconductor layer, and a semiconductor die. The first semiconductor layer is disposed over the substrate. The first interposer substrate is disposed over the first semiconductor layer and includes a first conductive via. The first conductive via has a first width decreasing in a direction toward the substrate. The second interposer substrate is bonded to the first interposer substrate and includes a second conductive via. The second conductive via has a second width increasing in the direction toward the substrate. The second semiconductor layer is disposed over the second interposer substrate. The semiconductor die is disposed over the second semiconductor layer and is electrically coupled to the first conductive via and the second conductive via.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
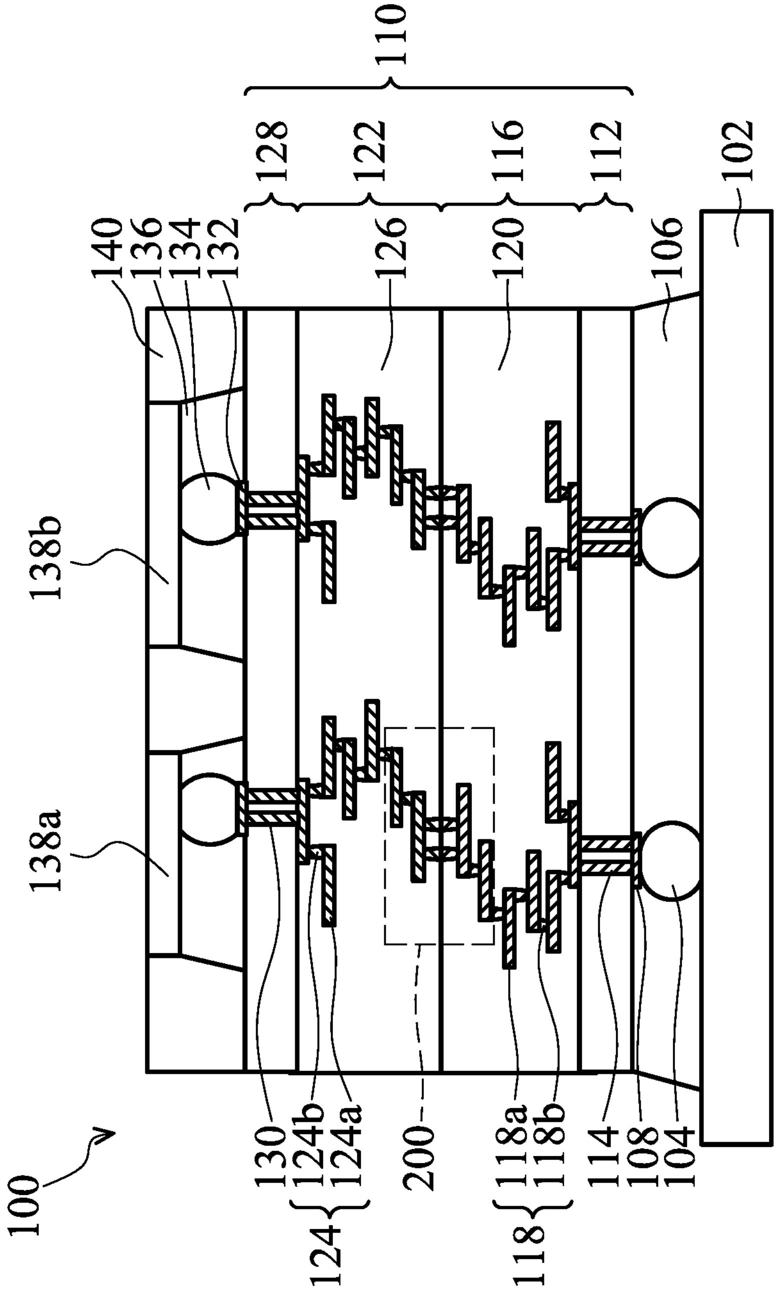
FIG. 1 is a cross-sectional view of an exemplary semiconductor package structure in accordance with some embodiments of the present disclosure.

The following description is made for the purpose of illustrating the general principles of the invention and should not be taken in a limiting sense. The scope of the invention is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Additional elements may be added on the basis of the embodiments described below. For example, the description "a first element on or over a second element" may include embodiments in which the first element is in direct contact with the second element, and may also include embodiments in which additional elements are disposed between the first element and the second element such that the first element and the second element are not in direct contact.

Furthermore, the description "a first element extending through a second element" may include embodiments in which the first element is disposed in the second element and extends from a side of the second element to the opposite side of the second element, wherein the surface of the first element may be substantially leveled with the surface of the second element, or the surface of the first element may be outside the surface of the second element.

The spatially relative descriptors of the first element and the second element may change as the structure is operated or used in different orientations. In addition, the present disclosure may repeat reference numerals and/or letters in the various embodiments. This repetition is for simplicity and clarity and does not in itself dictate a relationship between the various embodiments discussed.

A semiconductor package structure including a composite interposer is described in accordance with some embodiments of the present disclosure. The composite interposer includes at least two interposer substrates, so that the complex interconnection design requirement can be achieved.

FIG. 1 is a cross-sectional view of a semiconductor package structure 100 in accordance with some embodiments of the present disclosure. Additional features can be added to the semiconductor package structure 100. Some of the features described below can be replaced or eliminated for different embodiments. To simplify the diagram, only a portion of the semiconductor package structure 100 is illustrated.

As illustrated in FIG. 1, the semiconductor package structure 100 includes a substrate 102, in accordance with some embodiments. The substrate 102 may be a printed circuit board (PCB). The substrate 102 may include one or more layers of electrically-conductive traces. It should be noted that the configuration of the substrate 102 shown in the figures is exemplary only and is not intended to limit the present disclosure. Any desired semiconductor element may be formed in and on the substrate 102. However, in order to simplify the diagram, only the flat substrate 102 is illustrated.

The semiconductor package structure 100 includes a composite interposer 110 disposed over the substrate 102 and a plurality of bump structures 104 disposed therebetween, in accordance with some embodiments. The bump structures 104 may electrically couple the composite interposer 110 to the substrate 102.

The bump structures 104 may include microbumps, controlled collapse chip connection (C4) bumps, solder balls, ball grid array (BGA) balls, the like, or a combination thereof. The bump structures 104 may be formed of conductive materials, including metal, such as tungsten, titanium, tantalum, ruthenium, cobalt, copper, aluminum, platinum, tin, silver, gold, the like, an alloy thereof, or a combination thereof.

The semiconductor package structure 100 includes an underfill material 106 extending between the composite interposer 110 and the substrate 102, in accordance with some embodiments. The underfill material 106 may surround the bump structures 104 and may fill in gaps between the bump structures 104 to provide structural support. In some embodiments, the underfill material 106 includes polymer, such as epoxy. The underfill material 106 may be dispensed with capillary force, and then may be cured through any suitable curing process.

The semiconductor package structure 100 includes a plurality of conductive pads 108 disposed below the composite interposer 110 and electrically coupled to the bump structure 104, in accordance with some embodiments. The conductive pads 108 may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

As shown in FIG. 1, according to some embodiments, the composite interposer 110 includes a first semiconductor layer 112, a first interposer substrate 116, a second interposer substrate 122, and a second semiconductor layer 128, which are stacked vertically. The first semiconductor layer 112 may be formed of any suitable semiconductor material, such as silicon or germanium.

The composite interposer 110 may include a plurality of through vias 114 extending through the first semiconductor layer 112. The through vias 114 may be formed of conductive materials, and the exemplary conductive materials are previously described. The through vias 114 may be electrically coupled to the conductive pads 108.

The first interposer substrate 116 may be formed by depositing one or more first conductive structures 118 and first passivation layers 120 over the first semiconductor layer 112, wherein the first conductive structures 118 may be disposed in the first passivation layers 120. The first conductive structures 118 may be formed of metal, such as copper, titanium, tungsten, aluminum, the like, or a combination thereof. The first conductive structures 118 may include a plurality of first conductive layers **118*a* for horizontal interconnection and a plurality of first conductive vias 118*b*** for vertical interconnection.

In some embodiments, the first passivation layers 120 include a polymer layer, for example, polyimide (PI), polybenzoxazole (PBO), benzocyclobutene (BCB), epoxy, the like, or a combination thereof. Alternatively, the first passivation layers 120 may include a dielectric layer, such as silicon oxide, silicon nitride, silicon oxynitride, the like, or a combination thereof.

Similarly, the second semiconductor layer 128 may be formed of any suitable semiconductor material, such as silicon or germanium, and the second interposer substrate 126 may be formed by depositing one or more second conductive structures 124 and second passivation layers 126 over the second semiconductor layer 128. The second conductive structures 124 may be disposed in the second passivation layers 126.

The second conductive structures 124 may be formed of metal, such as copper, titanium, tungsten, aluminum, the like, or a combination thereof. The second conductive structures 124 may include a plurality of second conductive layers **124*a* for horizontal interconnection and a plurality of second conductive vias 124*b*** for vertical interconnection.

In some embodiments, the second passivation layers 126 include a polymer layer, for example, polyimide (PI), polybenzoxazole (PBO), benzocyclobutene (BCB), epoxy, the like, or a combination thereof. Alternatively, the second passivation layers 126 may include a dielectric layer, such as silicon oxide, silicon nitride, silicon oxynitride, the like, or a combination thereof.

Then, the composite interposer 110 may be formed by bonding the first interposer substrate 116 and the second interposer substrate 126, such as by hybrid bonding. The hybrid bonding may be a combination of dielectric-to-dielectric bonding and conductor-to-conductor bonding. For example, the first conductive structures 118 may be bonded to the second conductive structures 124 through conductor-to-conductor bonding, and the first passivation layers 120 may be bonded to the second passivation layers 126 through dielectric-to-dielectric bonding.

By bonding the first interposer substrate 116 and the second interposer substrate 126, a thicker interposer structure (i.e., the composite interposer 110) can be formed without warping. The composite interposer 110 may include more than eight layers of conductive structures (or passivation layers), such as ten layers or twelve layers. In addition, process complexity can be reduced, and manufacturing time can be shortened.

Furthermore, since the composite interposer 110 includes more layers, the complex interconnection design requirement can be achieved. As a result, a package substrate formed between an interposer and the substrate 102 can be omitted. The package substrate is generally formed of Ajinomoto build-up film (ABF), which results in a higher cost. Therefore, the cost can be reduced.

The composite interposer 110 may include a plurality of through vias 130 extending through the second semiconductor layer 128. The through vias 130 may be formed of conductive materials, and the exemplary conductive materials are previously described. The through vias 130 may be electrically coupled to a plurality of conductive pads 132. The conductive pads 132 may be similar to the conductive pads 108, and will not be repeated.

The semiconductor package structure 100 includes one or more semiconductor dies **138*a* and 138*b* disposed over the composite interposer 110, in accordance with some embodiments. In some embodiments, the semiconductor dies 138*a* and 138*b* each independently includes a system-on-chip (SoC) die, a logic device, a memory device, a radio frequency (RF) device, the like, or any combination thereof. For example, the semiconductor dies 138*a* and 138*b*** may each include a micro control unit (MCU) die, a microprocessor unit (MPU) die, a power management integrated circuit (PMIC) die, a radio frequency front end (RFFE) die, an accelerated processing unit (APU) die, a central processing unit (CPU) die, a graphics processing unit (GPU) die, an input-output (TO) die, a dynamic random access memory (DRAM) controller, a static random-access memory (SRAM), a high bandwidth memory (HBM), an application processor (AP) die, an application specific integrated circuit (ASIC) die, the like, or any combination thereof.

The semiconductor dies **138*a* and 138*b* may include the same or different devices. The semiconductor package structure 100 may include more than two semiconductor dies, and may also include one or more passive components disposed over the composite interposer 110**, such as resistors, capacitors, or inductors.

The semiconductor dies **138*a* and 138*b* may be electrically coupled to the composite interposer 110 through a plurality of bump structures 134. The bump structures 134 may include microbumps, controlled collapse chip connection (C4) bumps, solder balls, ball grid array (BGA) balls, the like, or a combination thereof. The bump structures 134** may be formed of conductive materials, including metal, such as tungsten, titanium, tantalum, ruthenium, cobalt, copper, aluminum, platinum, tin, silver, gold, the like, an alloy thereof, or a combination thereof.

The semiconductor package structure 100 includes an underfill material 136 extending between the composite interposer 110 and the semiconductor dies **138*a* and 138*b*, in accordance with some embodiments. The underfill material 136 may surround the bump structures 134 and may fill in gaps between the bump structures 136 to provide structural support. The underfill material 136 may be similar to the underfill material 106**, and will not be repeated.

The semiconductor package structure 100 includes a molding material 140 disposed over the composite interposer 110, in accordance with some embodiments. The molding material 140 may surround the semiconductor dies **138*a* and 138*b*, the bump structures 134, and the underfill material 136 to protect these components from the environment, thereby preventing them from damage due to stress, chemicals, and moisture. The molding material 140** may be formed of a nonconductive material, including moldable polymer, epoxy, resin, the like, or a combination thereof.

As shown in FIG. 1, the sidewall of the molding material 140 may be substantially coplanar with the sidewall of the composite interposer 110. In particular, the sidewall of the molding material 140 may be substantially coplanar with the sidewalls of the first semiconductor layer 112, the first interposer substrate 116, the second interposer substrate 122, and the second semiconductor layer 128. In some embodiments, the top surfaces of the semiconductor dies **138*a* and 138*b* are exposed by the molding material 140 as shown in FIG. 1**.

Figure 2:
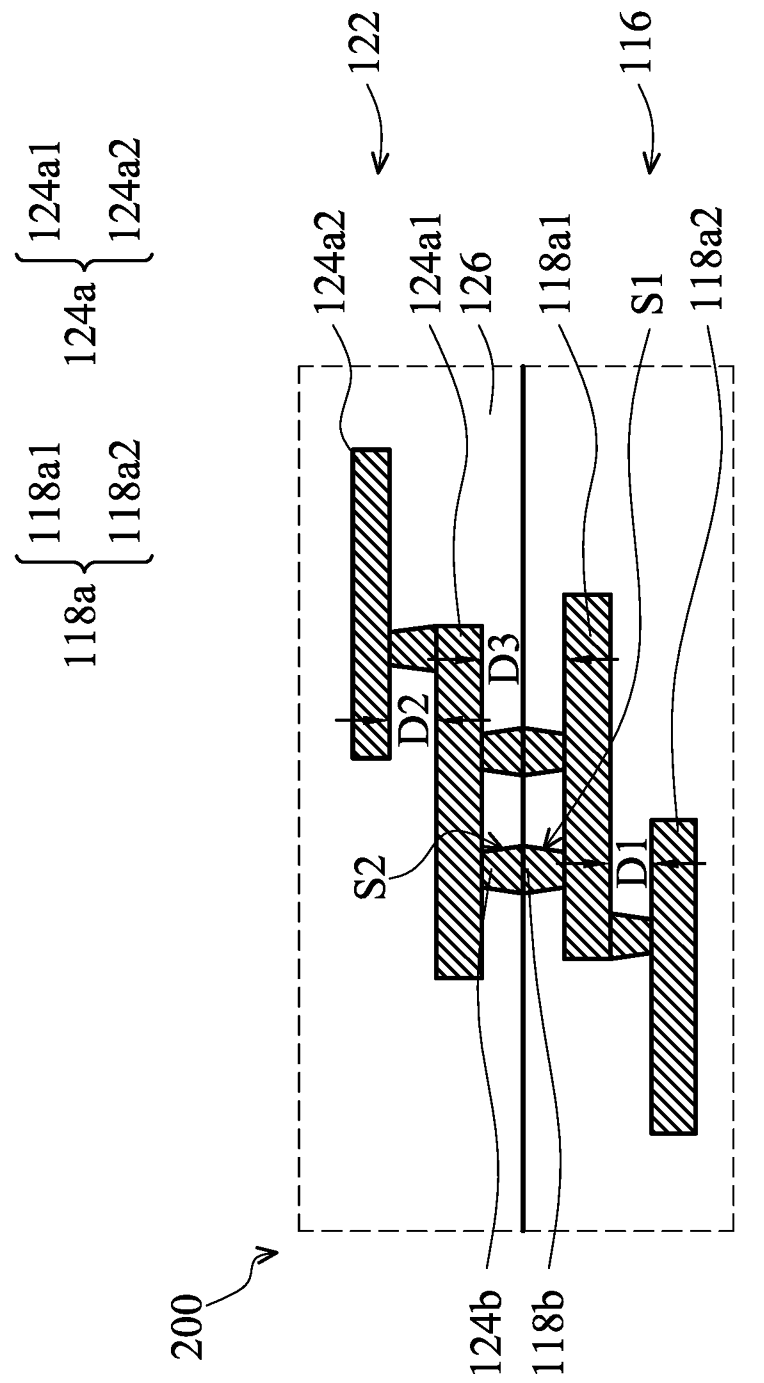
FIG. 2 is a cross-sectional view of a portion of an exemplary semiconductor package structure in accordance with some embodiments of the present disclosure.

FIG. 2 is a cross-sectional view of a portion 200 of the semiconductor package structure 100, in accordance with some embodiments of the disclosure. The portion 200 of the semiconductor package structure in FIG. 2 may include the same or similar components as that of the semiconductor package structure 100 in FIG. 1, and for the sake of simplicity, those components will not be discussed in detail again.

As illustrated in FIG. 2, according to some embodiments, since the first interposer substrate 116 and the second interposer substrate 122 are formed over the first semiconductor layer 112 and the second semiconductor layer 128, respectively, the first conductive vias **118*b* and the second conductive vias 124*b*** may be tapered in different directions.

In particular, the first conductive via **118*b* may have a first width decreasing in a direction toward the substrate 102, and the second conductive via 124*b* may have a second width increasing in the direction toward the substrate 102. That is, the top surface area of the first conductive via 118*b* may be greater than the bottom surface area of the first conductive via 118*b*, and the bottom surface area of the second conductive via 124*b* may be greater than the top surface area of the second conductive via 124*b***.

As shown in FIG. 2, the bottom surface area of the second conductive via **124*b* may be substantially equal to the top surface area of the first conductive via 118*b*. The bottom surface area of the second conductive via 124*b* may be substantially aligned with the top surface area of the first conductive via 118*b*. That is, the second conductive via 124*b* may vertically overlap the first conductive via 118*b***.

As shown in FIG. 2, the first conductive via **118*b* may have a first inclined sidewall S1, and the second conductive via 124*b* may have a second inclined sidewall S2. The first inclined sidewall S1 and the second inclined sidewall S2 may extend in different directions. In some embodiments, the first inclined sidewall S1 of the first conductive via 118*b* connects the second inclined sidewall S2 of the second conductive via 124*b***.

The first conductive layers **118*a* may include a topmost conductive layer 118*a*1 and a first conductive layer 118*a*2 below the topmost conductive layer 118*a*1. The topmost conductive layer 118*a*1 and the first conductive layer 118*a*2 may be spaced a first distance D1 apart by the first conductive via 118*b*. The second conductive layers 124*a* may include a bottommost conductive layer 124*a*1 and a second conductive layer 124*a*2 over the bottommost conductive layer 124*a*1. The bottommost conductive layer 124*a*1 and the second conductive layer 124*a*2 may be spaced a second distance D2 apart by the second conductive via 124*b***.

The topmost conductive layer **118*a*1 of the first interposer substrate 116 and the bottommost conductive layer 124*a*1 of the second interposer substrate 122 may be spaced a third distance D3 apart by the first conductive via 118*b* and the second conductive via 124*b*. The third distance D3 may be greater than the first distance D1 and may be greater than the second distance D2. In some embodiments, the third distance D3 is substantially equal to the sum of the first distance D1 and the second distance D2**.

Figure 3:
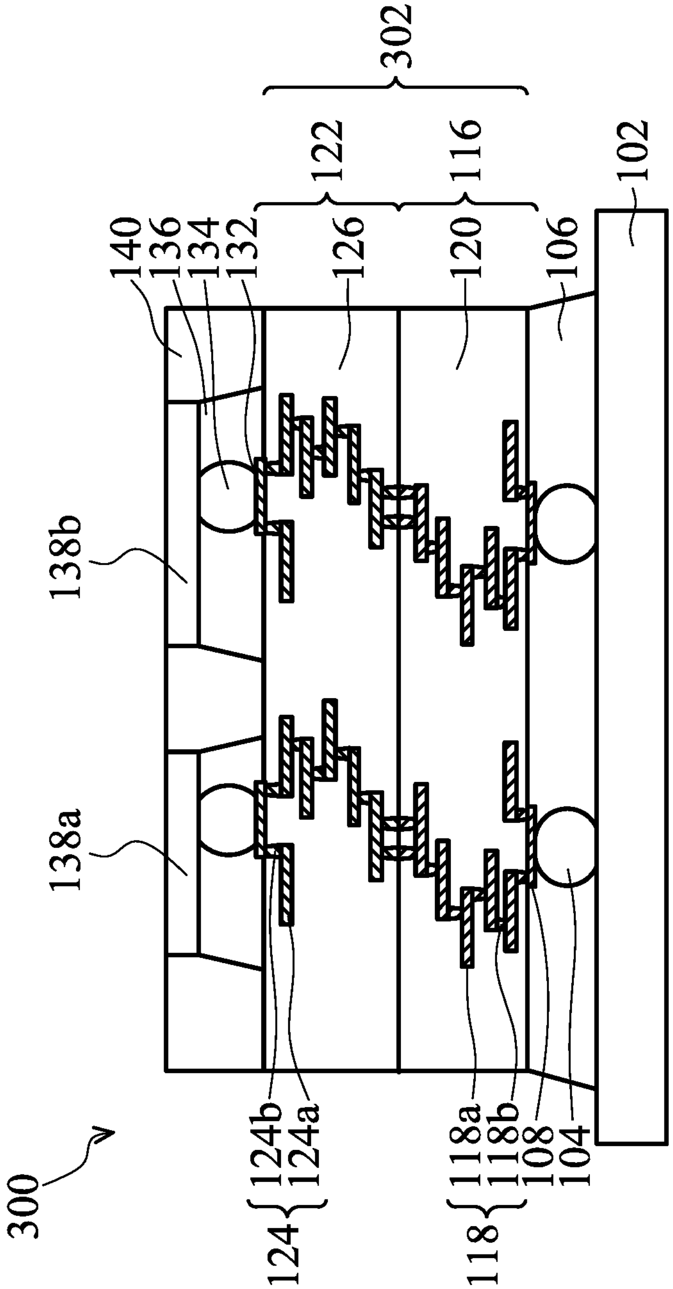
FIG. 3 is a cross-sectional view of an exemplary semiconductor package structure in accordance with some embodiments of the present disclosure.

FIG. 3 is a cross-sectional view of a semiconductor package structure 300, in accordance with some embodiments of the disclosure. It should be noted that the semiconductor package structure 300 may include the same or similar components as those of the semiconductor package structure 100, which is illustrated in FIG. 1, and for the sake of simplicity, those components will not be discussed in detail again. In the following embodiments, a composite interposer does not include semiconductor layers.

As shown in FIG. 3, the semiconductor package structure 300 includes a composite interposer 302 disposed over the substrate 102, in accordance with some embodiments. The composite interposer 302 may include a first interposer substrate 116 and a second interposer substrate 122, which are stacked vertically. According to some embodiments, the composite interposer 302 without semiconductor layers can reduce the thickness of the semiconductor package structure 300.

The semiconductor package structure 300 includes a plurality of conductive pads 108 disposed below the composite interposer 302 and a plurality of conductive pads 132 disposed over the composite interposer 302, in accordance with some embodiments. The conductive pads 108 may electrically couple the first conductive structures 118 of the first interposer substrate 116 to the bump structure 104, and the conductive pads 132 may electrically couple the second conductive structures 124 of the second interposer substrate 122 to the bump structure 134.

The molding material 140 may be disposed over the composite interposer 110 and may be in contact with the second interposer substrate 122. The underfill material 106 may extend between the composite interposer 110 and the substrate 102 and may be in contact with the first interposer substrate 116.

It should be noted that the components in the semiconductor package structures 100 and 300 may be combined in any suitable manner in one or more embodiments. For example, although not illustrated, a composite interposer may include one semiconductor layer disposed below the first interposer substrate 116 or disposed over the second interposer substrate 122. Consequently, design flexibility can be improved, and mechanical strength can be increased.

In summary, the semiconductor package structure according to the present disclosure includes a composite interposer, which includes at least two interposer substrates. These interposer substrates are formed separately, so that a thicker interposer structure can be formed without warping. In addition, process complexity can be reduced, and manufacturing time can be shortened. Furthermore, the composite interposer including more layers can achieve the complex interconnection design requirement. As a result, a package substrate can be omitted to reduce the cost.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:

a substrate;

a composite interposer disposed over the substrate and comprising:

a first interposer substrate comprising a first conductive via and a first dielectric layer; and a second interposer substrate disposed over the first interposer substrate and comprising a second conductive via and a second dielectric layer, wherein the second conductive via is bonded to the first conductive via, and the second dielectric layer is bonded to the first dielectric layer;

a semiconductor die disposed over the composite interposer and electrically coupled to the first conductive via and the second conductive via; and a molding material surrounding the semiconductor die, wherein a sidewall of the molding material is coplanar with sidewalls of the first interposer substrate and the second interposer substrate.

2. The semiconductor package structure as claimed in claim 1, wherein a first top surface area of the first conductive via is greater than a first bottom surface area of the first conductive via, and a second bottom surface area of the second conductive via is greater than a second top surface area of the second conductive via.

3. The semiconductor package structure as claimed in claim 2, wherein the second bottom surface area of the second conductive via is substantially equal to the first top surface area of the first conductive via.

4. The semiconductor package structure as claimed in claim 1, wherein the composite interposer further comprises a semiconductor layer disposed below the first interposer substrate and comprising a through via.

5. The semiconductor package structure as claimed in claim 4, wherein the substrate is electrically coupled to the first interposer substrate through the through via and a bump structure.

6. The semiconductor package structure as claimed in claim 1, wherein the composite interposer further comprises a semiconductor layer disposed over the second interposer substrate and comprising a through via, wherein the semiconductor layer is electrically coupled to the semiconductor die through the through via and a bump structure.

7. The semiconductor package structure as claimed in claim 1, further comprising a conductive pad disposed below the first interposer substrate and electrically coupling the substrate to the first interposer substrate.

8. A semiconductor package structure, comprising:

a substrate;

a composite interposer disposed over the substrate and comprising:

a first interposer substrate comprising a first conductive via, wherein the first conductive via has a first inclined sidewall; and a second interposer substrate bonded to the first interposer substrate and comprising a second conductive via, wherein the second conductive via has a second inclined sidewall connected to the first inclined sidewall;

a bump structure electrically coupling the composite interposer to the substrate;

a first semiconductor die disposed over the composite interposer and electrically coupled to the composite interposer; and a molding material surrounding the first semiconductor die, wherein a sidewall of the molding material is coplanar with a sidewall of the composite interposer.

9. The semiconductor package structure as claimed in claim 8, wherein the first inclined sidewall extends in a first direction, and the second inclined sidewall extends in a second direction different from the first direction.

10. The semiconductor package structure as claimed in claim 8, wherein the first conductive via has a third inclined sidewall, and the second conductive via has a fourth inclined sidewall connected to the third inclined sidewall.

11. The semiconductor package structure as claimed in claim 8, wherein the composite interposer further comprises:
- a first semiconductor layer bonded to the first interposer substrate and comprising a first through via electrically coupled to the bump structure; and
- a second semiconductor layer bonded to the second interposer substrate and comprising a second through via electrically coupled to the first semiconductor die.

12. The semiconductor package structure as claimed in claim 11, further comprising a plurality of conductive pads disposed on opposite sides of the composite interposer and electrically coupled to the first through via and the second through via.

13. The semiconductor package structure as claimed in claim 11, wherein sidewalls of the first semiconductor layer, the first interposer substrate, the second interposer substrate, and the second semiconductor layer are coplanar.

14. The semiconductor package structure as claimed in claim 11, further comprising a second semiconductor die electrically coupled to a third through via of the second semiconductor layer.

15. The semiconductor package structure as claimed in claim 14, wherein the molding material further surrounds the second semiconductor die.

16. A semiconductor package structure, comprising:
- a substrate;
- a first semiconductor layer disposed over the substrate;
- a first interposer substrate disposed over the first semiconductor layer and comprising a first conductive via, wherein the first conductive via has a first width decreasing in a direction toward the substrate;
- a second interposer substrate bonded to the first interposer substrate and comprising a second conductive via, wherein the second conductive via has a second width increasing in the direction toward the substrate;
- a second semiconductor layer disposed over the second interposer substrate;
- a semiconductor die disposed over the second semiconductor layer and electrically coupled to the first conductive via and the second conductive via; and
- a molding material surrounding the semiconductor die, wherein a sidewall of the molding material is coplanar with sidewalls of the first semiconductor layer, the first interposer substrate, the second interposer substrate, and the second semiconductor layer.

17. The semiconductor package structure as claimed in claim 16, wherein the second interposer substrate is bonded to first interposer substrate through hybrid bonding.

18. The semiconductor package structure as claimed in claim 16, further comprising a plurality of through vias extending in the first semiconductor layer and the second semiconductor layer.

19. The semiconductor package structure as claimed in claim 16, further comprising an underfill material extending between the substrate and the first semiconductor layer and covering an edge of the first semiconductor layer.

* * * * *